(12) United States Patent
Cho et al.

(10) Patent No.: US 10,529,919 B2
(45) Date of Patent: Jan. 7, 2020

(54) METHOD OF MANUFACTURING A MAGNETORESISTIVE RANDOM ACCESS MEMORY DEVICE USING HARD MASKS AND SPACERS

(71) Applicant: SAMSUNG ELECTRONICS CO., LTD., Suwon-si, Gyeonggi-do (KR)

(72) Inventors: Han-Na Cho, Seongnam-si (KR); Hye-Ji Yoon, Hwaseong-si (KR); O-Ik Kwon, Yongin-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 16/044,666

(22) Filed: Jul. 25, 2018

(65) Prior Publication Data
US 2019/0088864 A1    Mar. 21, 2019

(30) Foreign Application Priority Data
Sep. 20, 2017    (KR) .......................... 10-2017-0121447

(51) Int. Cl.
*H01L 43/12*    (2006.01)
*H01L 43/02*    (2006.01)
(Continued)

(52) U.S. Cl.
CPC .......... *H01L 43/12* (2013.01); *H01L 27/222* (2013.01); *H01L 27/224* (2013.01); *H01L 27/226* (2013.01); *H01L 27/228* (2013.01); *H01L 43/02* (2013.01); *H01L 43/08* (2013.01); *G11C 11/161* (2013.01)

(58) Field of Classification Search
CPC ......... H01L 43/12; H01L 43/02; H01L 43/08; H01L 27/224; H01L 27/226; H01L 27/228
See application file for complete search history.

(56) References Cited

U.S. PATENT DOCUMENTS 6,939,722 B2    9/2005 Okazawa et al.
8,119,425 B2    2/2012 Cho et al.
(Continued)

FOREIGN PATENT DOCUMENTS

KR    10-2011-0002706 A    1/2011
KR    10-2013-0038603 A    4/2013
KR    10-2016-0118386 A    10/2016

*Primary Examiner* — Michael Jung
(74) *Attorney, Agent, or Firm* — Lee & Morse, P.C.

(57) ABSTRACT

A method of manufacturing an MRAM device including forming a first insulating interlayer and a lower electrode contact, the lower electrode contact extending through the first insulating interlayer; forming a lower electrode layer, a magnetic tunnel junction layer, an upper electrode layer, and a first hard mask layer on the first insulating interlayer and lower electrode contact; forming a second hard mask on the first hard mask layer; etching the first hard mask layer and upper electrode layer to form a first hard mask and upper electrode; forming a spacer on sidewalls of the upper electrode and hard masks; and etching the magnetic tunnel junction layer and the lower electrode layer to form a structure including a lower electrode and a magnetic tunnel junction pattern on the lower electrode contact, wherein a layer remains on the upper electrode after etching the magnetic tunnel junction layer and the lower electrode layer.

20 Claims, 22 Drawing Sheets

(51) Int. Cl.
  *H01L 43/08* (2006.01)
  *H01L 27/22* (2006.01)
  *G11C 11/16* (2006.01)

(56) References Cited

U.S. PATENT DOCUMENTS

| | | | |
|---|---|---|---|
| 8,536,063 | B2 | 9/2013 | Satoh et al. |
| 8,952,434 | B2* | 2/2015 | Nam .................. H01L 43/12 |
| | | | 257/295 |
| 9,129,690 | B2 | 9/2015 | Park et al. |
| 9,136,463 | B2 | 9/2015 | Li et al. |
| 9,159,912 | B2 | 10/2015 | Lee et al. |
| 9,263,667 | B1 | 2/2016 | Pinarbasi |
| 9,559,294 | B2 | 1/2017 | Hsu et al. |
| 9,595,661 | B2 | 3/2017 | Hsu et al. |
| 2011/0111532 | A1* | 5/2011 | Ryu .................. H01L 27/228 |
| | | | 438/3 |
| 2015/0188037 | A1* | 7/2015 | Nam .................. H01L 43/12 |
| | | | 257/421 |
| 2016/0035969 | A1 | 2/2016 | Kang et al. |
| 2016/0079518 | A1* | 3/2016 | Pi .................. H01L 43/10 |
| | | | 257/421 |
| 2016/0133833 | A1 | 5/2016 | Lu et al. |
| 2016/0141496 | A1* | 5/2016 | Park .................. H01L 43/08 |
| | | | 438/3 |
| 2016/0308112 | A1 | 10/2016 | Tan et al. |
| 2016/0351238 | A1 | 12/2016 | Doyle et al. |
| 2017/0069832 | A1 | 3/2017 | Kim et al. |
| 2017/0084828 | A1* | 3/2017 | Hsu .................. H01L 43/12 |
| 2017/0092847 | A1* | 3/2017 | Kim .................. G11C 11/161 |
| 2017/0092850 | A1* | 3/2017 | Lee .................. H01L 43/12 |
| 2017/0200723 | A1* | 7/2017 | Lee .................. H01L 23/528 |
| 2018/0040808 | A1* | 2/2018 | Nam .................. H01L 43/02 |
| 2018/0346851 | A1* | 12/2018 | Moon ................ C11D 11/0047 |
| 2018/0366638 | A1* | 12/2018 | Lin .................. H01L 43/08 |

\* cited by examiner

US 10,529,919 B2

METHOD OF MANUFACTURING A MAGNETORESISTIVE RANDOM ACCESS MEMORY DEVICE USING HARD MASKS AND SPACERS

CROSS-REFERENCE TO RELATED APPLICATION

Korean Patent Application No. 10-2017-0121447, filed on Sep. 20, 2017 in the Korean Intellectual Property Office (KIPO), and entitled: "Method of Manufacturing a Magnetoresistive Random Access Memory Device," is incorporated by reference herein in its entirety.

BACKGROUND

1. Field

Embodiments relate to a method of manufacturing a magnetoresistive random access memory (MRAM) device.

2. Description of the Related Art

When an MRAM device is manufactured, a magnetic tunnel junction (MTJ) layer may be etched by a physical etching process to form an MTJ structure.

SUMMARY

The embodiments may be realized by providing a method of manufacturing an MRAM device, the method including forming a first insulating interlayer and a lower electrode contact on a substrate such that the lower electrode contact extends through the first insulating interlayer; sequentially forming a lower electrode layer, a magnetic tunnel junction layer, an upper electrode layer, and a first hard mask layer on the first insulating interlayer and the lower electrode contact; forming a second hard mask on the first hard mask layer; etching the first hard mask layer and the upper electrode layer using the second hard mask as an etching mask to form a first hard mask and an upper electrode, respectively; forming a spacer on sidewalls of the upper electrode, the first hard mask, and the second hard mask; and etching the magnetic tunnel junction layer and the lower electrode layer using the first hard mask, the second hard mask, and the spacer as an etching mask to form a structure including a lower electrode and a magnetic tunnel junction pattern on the lower electrode contact, wherein at least one layer remains on the upper electrode after etching the magnetic tunnel junction layer and the lower electrode layer.

The embodiments may be realized by providing a method of manufacturing an MRAM device, the method including forming a first insulating interlayer and a lower electrode contact on a substrate such that the lower electrode contact extends through the first insulating interlayer; sequentially forming a lower electrode layer, a magnetic tunnel junction layer, an upper electrode layer, a first capping layer, and a first hard mask layer on the first insulating interlayer and the lower electrode contact; forming a second hard mask on the first hard mask layer; etching the first hard mask layer, the first capping layer, and the upper electrode layer using the second hard mask as an etching mask to form a first hard mask, a first capping layer pattern, and an upper electrode, respectively; forming a spacer on sidewalls of the upper electrode, the first capping layer pattern, and the first and second hard masks; and etching the magnetic tunnel junction layer and the lower electrode layer using the first hard mask, the second hard mask, and the spacer as an etching mask to form a structure including a lower electrode and a magnetic tunnel junction pattern on the lower electrode contact, wherein the capping layer pattern remains on the upper electrode after etching the magnetic tunnel junction layer and the lower electrode layer.

The embodiments may be realized by providing a method of manufacturing an MRAM device, the method comprising forming a first insulating interlayer and a lower electrode contact on a substrate such that the lower electrode contact extends through the first insulating interlayer; sequentially forming a lower electrode layer, a magnetic tunnel junction layer, an upper electrode layer, and a first hard mask layer on the first insulating interlayer and the lower electrode contact such that the first hard mask layer includes a metal that is different from a metal of the upper electrode layer; forming a second hard mask on the first hard mask layer; etching the first hard mask layer and the upper electrode layer using the second hard mask as an etching mask to form a first hard mask and an upper electrode, respectively; forming a spacer on sidewalls of the upper electrode and the first and second hard masks; and etching the magnetic tunnel junction layer and the lower electrode layer using the first hard mask, the second hard mask, and the spacer as an etching mask to form a structure including a lower electrode and a magnetic tunnel junction pattern on the lower electrode contact, wherein the first hard mask remains on the upper electrode after etching the magnetic tunnel junction layer and the lower electrode layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
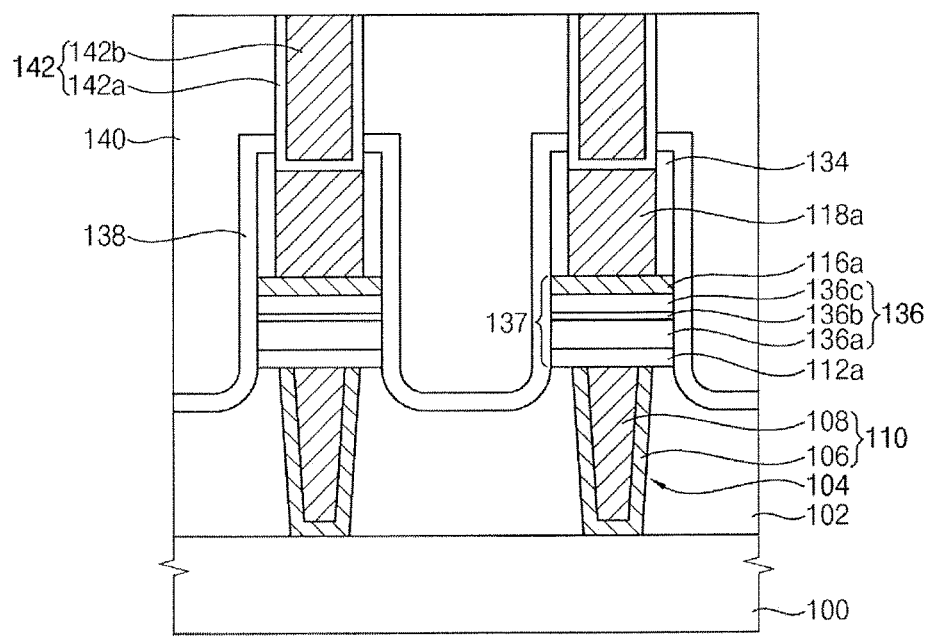
FIG. 1 illustrates a cross-sectional view of an MRAM device in accordance with example embodiments.

FIG. 1 illustrates a cross-sectional view of an MRAM device in accordance with example embodiments.

Referring to FIG. 1, the MRAM device may include a first insulating interlayer 102, a lower electrode contact 110, a lower electrode 112a, an MTJ structure 136, a middle electrode 116a, and an upper electrode 118a on a substrate 100. A spacer 134 may be formed on a sidewall of the upper electrode 118a.

The substrate 100 may include a semiconductor material, e.g., silicon, germanium, silicon-germanium, or III-V semiconductor compounds, e.g., GaP, GaAs, GaSb, etc. In an implementation, the substrate 100 may be a silicon-on-insulator (SOI) substrate or a germanium-on-insulator (GOI) substrate.

In an implementation, various types of elements, e.g., word lines, transistors, diodes, source/drain regions, source lines, contact plugs, wirings, etc., and an insulating interlayer covering the elements may be further formed on the substrate 100.

The first insulating interlayer 102 may include silicon oxide, or a low-k dielectric material having a dielectric constant less than that of silicon oxide, i.e., less than about 3.9. For example, the first insulating interlayer 102 may include silicon oxide doped with carbon (SiCOH) or silicon oxide doped with fluorine (F—$SiO_2$), a porous silicon oxide, spin on organic polymer, or an inorganic polymer, e.g., hydrogen silsesquioxane (HSSQ), methyl silsesquioxane (MSSQ), etc.

The lower electrode contact 110 may fill a first opening 104 extending through the first insulating interlayer 102. The lower electrode contact 110 may include a barrier pattern 106 and a conductive pattern 108. The barrier pattern 106 may be formed on a sidewall and a bottom of the first opening 104. The conductive pattern 108 may be formed on the barrier pattern 106 to fill the first opening 104. The barrier pattern 106 may include a metal nitride, e.g., tungsten nitride, tantalum nitride, titanium nitride, etc., or a metal, e.g., tantalum, titanium, etc. The conductive pattern 108 may include a metal having a low resistance, e.g., tungsten, copper, aluminum, etc.

The lower electrode 112a, the MTJ structure 136, and the middle electrode 116a may be sequentially stacked to have a pillar structure. A first structure 137 including the lower electrode 112a, the MTJ structure 136, and the middle electrode 116a may contact the lower electrode contact 110.

The first structure 137 may be formed on the lower electrode contact 110 and the first insulating interlayer 102. In an implementation, a lower surface of the first structure 137 may be greater than or larger in area than an upper surface of the lower electrode contact 110. In an implementation, an upper surface of the first insulating interlayer 102 adjacent to the lower electrode contact 110 may be lower than the upper surface of the lower electrode contact 110.

The lower electrode 112a may include a metal nitride, e.g., tantalum nitride, titanium nitride, etc., or a metal, e.g., tantalum, titanium, etc. For example, when an element such as the lower electrode 112a is described as including metal, e.g., tantalum, titanium, etc., the metal may be the metallic element by itself.

The MTJ structure 136 may include a first magnetic pattern 136a, a tunnel barrier pattern 136b, and a second magnetic pattern 136c sequentially stacked.

In an implementation, the first magnetic pattern 136a may serve as a fixed layer having a fixed magnetization direction. In an implementation, the first magnetic pattern 136a may include a fixed pattern, a lower ferromagnetic pattern, an anti-ferromagnetic coupling spacer pattern, and an upper ferromagnetic pattern. In an implementation, the fixed pattern may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic patterns may include, e.g., Fe, Ni, and/or Co. The anti-ferromagnetic coupling spacer pattern may include, e.g., Ru, Ir, and/or Rh.

In an implementation, the second magnetic pattern 136c may serve as a free layer having a changeable magnetization direction. In an implementation, the second magnetic pattern 136c may include a ferromagnetic material, e.g., Fe, Ni, Co, Cr, Pt, etc. The second magnetic pattern 136c may further include, e.g., boron, silicon, etc. The second magnetic pattern 136c may include composite materials including at least two of the ferromagnetic materials. In an implementation, the second magnetic pattern 136c may include, e.g., CoFe, NiFe, FeCr, CoFeNi, PtCr, CoCrPt, CoFeB, NiFeSiB, CoFeSiB, etc.

The tunnel barrier pattern 136b may be disposed between the first and second magnetic patterns 136a and 136c. Thus, the first and second magnetic patterns 136a and 136c may not directly contact each other.

In an implementation, the tunnel barrier pattern 136b may include a metal oxide having an insulating material or property, e.g., aluminum oxide or magnesium oxide.

In an implementation, the middle electrode 116a may include a metal nitride, e.g., tantalum nitride, titanium nitride, etc., or a metal, e.g., tantalum, titanium, etc.

The upper electrode 118a may be formed on the middle electrode 116a. The upper electrode 118a may include a metal, e.g., tungsten (W), Cu, Pt, Ni, Ag, Au, etc. For example, the upper electrode 118a may include tungsten. A width of the upper electrode 118a may be less than a width of the first structure 137. The upper electrode 118a and the spacer 134 on a sidewall of the upper electrode 118a may form a second structure. A width of the second structure may be substantially the same as the width of the first structure 137.

The spacer 134 may include a material having a resistance higher that is than a resistance of the upper electrode 118a. In an implementation, the spacer 134 may include an insulating material, e.g., silicon oxide.

Figure 10:
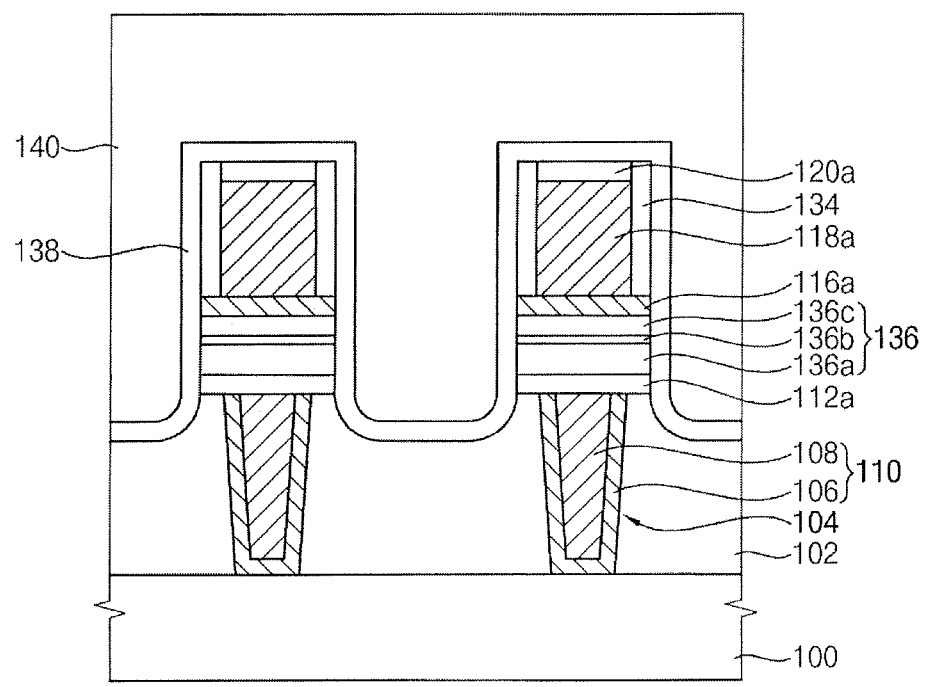

In an implementation, as shown in FIG. 10, a first capping layer pattern 120a may be formed on an upper surface of the upper electrode 118a. A second capping layer 138 may be formed on the spacer 134, the first capping layer pattern 120a, and the first insulating interlayer 102.

The first capping layer pattern 120a may include a material having a resistance that is higher than a resistance of the upper electrode 118a. In an implementation, the first capping layer pattern 120a may include an insulating material, e.g., silicon oxide, or a conductive material including a metal, e.g., titanium, titanium nitride, tantalum, tantalum nitride, etc.

The second capping layer 138 may be conformally formed on the spacer 134, the first structure 137, and the first insulating interlayer 102. Thus, the second capping layer 138 may not directly contact the upper electrode 118a. The second capping layer 138 may directly contact the first structure 137, so that the second capping layer 138 may protect the first structure 137.

A second insulating interlayer 140 may be formed on the second capping layer 138. The second insulating layer 140 may fill a gap between the upper electrodes 118a.

A via contact 142 may extend through the second insulating interlayer 140, and may contact the upper electrode 118a. The via contact 142 may include a second barrier pattern 142a and a metal pattern 142b.

The second barrier pattern 142a may include a metal nitride, e.g., tungsten nitride, tantalum nitride, titanium nitride, etc., and/or a metal, e.g., tantalum, titanium, etc. The metal pattern 142b may include a metal, e.g., tungsten, Cu, Al, etc.

In an implementation, as shown in FIG. 1, the via contact 142 may be formed on the upper electrode 118a, and the first capping pattern 120a (refer to FIG. 10) may not remain on the upper electrode. In an implementation, the via contact 142 may be formed on the upper electrode 118a, and the first capping pattern may partially remain on the upper electrode 118a adjacent to the via contact 142.

FIGS. 2 to 11 illustrate cross-sectional views of stages in a method of manufacturing an MRAM device in accordance with example embodiments.

Figure 2:
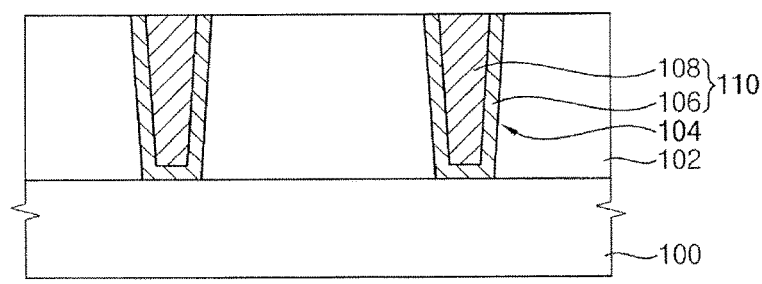
FIGS. 2 to 11 illustrate cross-sectional views of stages in a method of manufacturing an MRAM device in accordance with example embodiments.

Referring to FIG. 2, a first insulating interlayer 102 may be formed on a substrate 100. A lower electrode contact 110 may be formed through the first insulating interlayer 102.

For example, an etching mask may be formed on the first insulating interlayer 102. The first insulating interlayer 102 may be anisotropically etched using the etching mask to form a first opening 104 exposing an upper surface of the substrate 100. The anisotropic etching process may include a chemical etching process, e.g., a reactive ion etching (RIE) process.

A first barrier layer may be formed on an inner wall of the first opening 104, the exposed upper surface of the substrate 100, and the first insulating interlayer 102. A first conductive layer may be formed on the first barrier layer to fill the first opening 104. In an implementation, the first barrier layer and the first conductive layer may be formed by a chemical vapor deposition (CVD) process or an atomic layer deposition (ALD) process.

The first barrier layer and the first conductive layer may be planarized until an upper surface of the first insulating interlayer 102 is exposed to form the lower electrode contact 110 filling the first opening 104. The lower electrode contact 110 may include a barrier pattern 106 and a conductive pattern 108.

Figure 3:
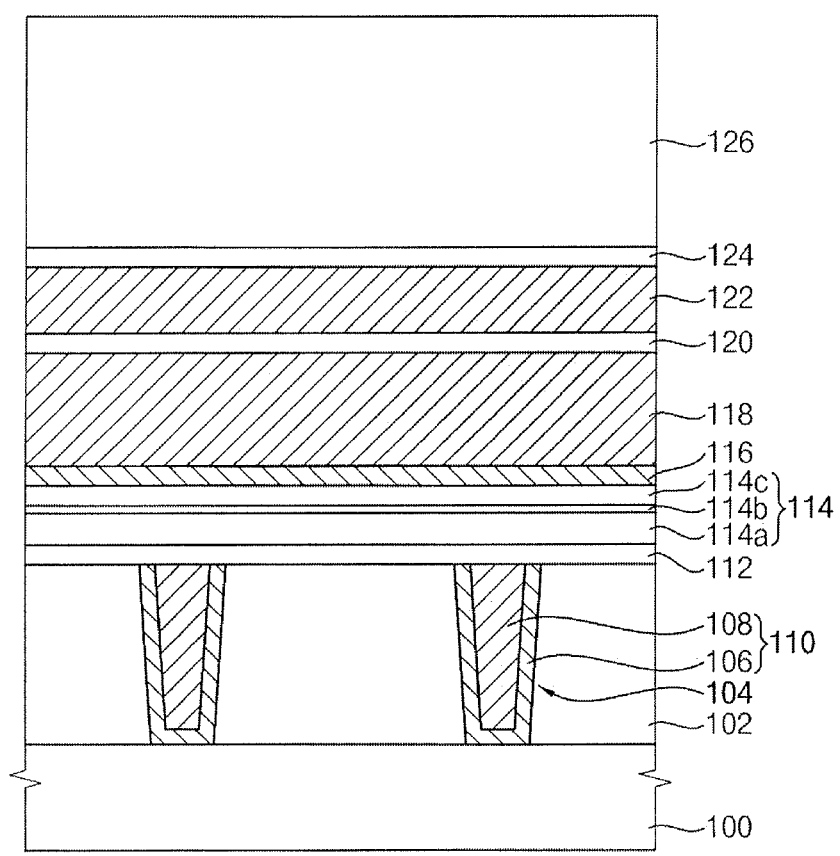

Referring to FIG. 3, a lower electrode layer 112, an MTJ layer 114, and a middle electrode layer 116 may be sequentially formed on the first insulating interlayer 102 and the lower electrode contact 110. An upper electrode layer 118, a first capping layer 120, a first hard mask layer 122, an adhesion layer 124, and a mold layer 126 may be sequentially formed on the middle electrode layer 116.

The lower electrode layer 112 may be formed of a metal, e.g., tantalum, titanium, etc., and/or a metal nitride, e.g., tantalum nitride, titanium nitride, etc.

The MTJ layer 114 may include a first magnetic layer 114a, a tunnel barrier layer 114b, and a second magnetic layer 114c sequentially stacked.

The middle electrode layer 116 may be formed of a metal, e.g., tantalum, titanium, etc., and/or a metal nitride, e.g., tantalum nitride, titanium nitride, etc.

The upper electrode layer 118 may be formed of a metal, e.g., tungsten, Cu, Pt, Ni Ag, Au, etc. In an implementation, the upper electrode layer 118 may be formed of tungsten.

The first capping layer 120 may be formed of a material having a resistance that is higher than that of the upper electrode layer 118.

In an implementation, the first capping layer 120 may be formed of an insulation material, e.g., silicon oxide. In an implementation, the first capping layer 120 may be formed of a conductive material. In an implementation, the conductive material included in the first capping layer 120 may serve as an insulating material when it is oxidized. In an implementation, the first capping layer 120 may be formed of a metal, e.g., tantalum, titanium, etc., and/or a metal nitride, e.g., tantalum nitride, titanium nitride, etc.

The first hard mask layer 122 may be formed of a metal. In an implementation, the first hard mask layer 122 may have a material substantially the same as a material of the upper electrode layer 118. In an implementation, the first hard mask layer 122 may be formed of tungsten.

The adhesion layer 124 may be formed so that the mold layer 126 may be bonded thereto. In an implementation, the adhesion layer 124 may be formed of, e.g., silicon nitride.

The mold layer 126 may serve as a mold for forming a second hard mask by a subsequent damascene process. The mold layer 126 may include carbon, e.g., a spin on hard mask (SOH).

Figure 4:
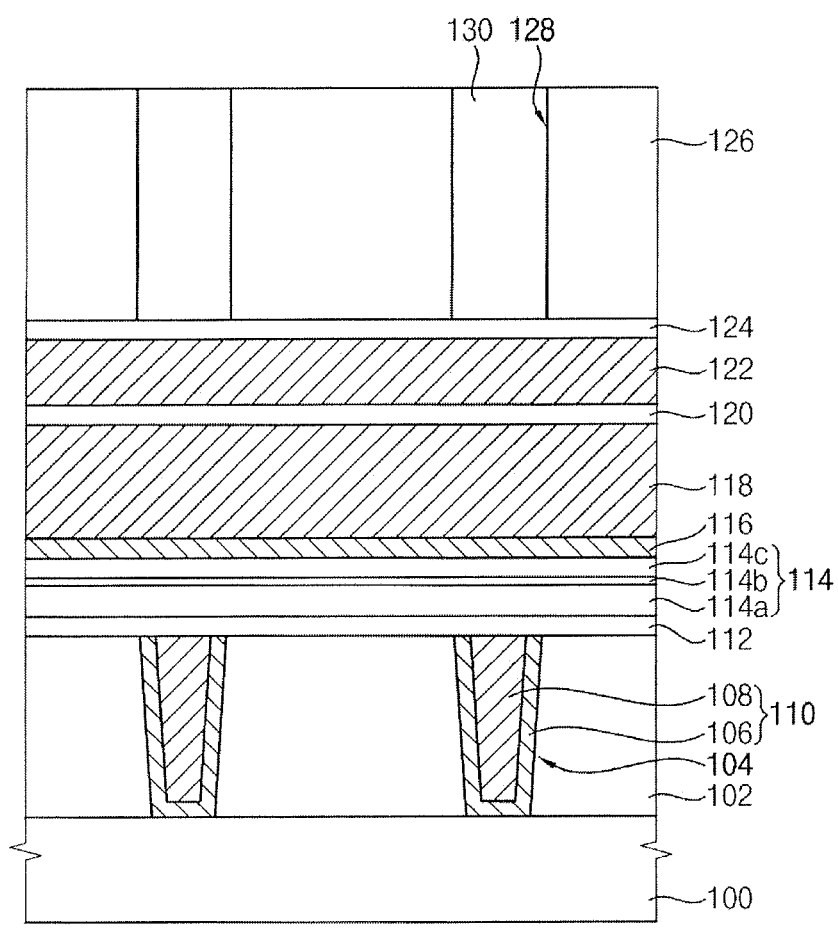

Referring to FIG. 4, a portion of the mold layer 126 may be etched to form an opening 128. The opening 128 may be positioned at an area overlapping an area for forming an upper electrode, and may have an isolated hole shape. A second hard mask layer may be formed to fill the opening 128. In an implementation, the second hard mask layer may be formed of, e.g., silicon oxide.

The second hard mask layer may be planarized until an upper surface of the mold layer 126 is exposed to form a second hard mask 130 filling the opening 128.

Figure 5:
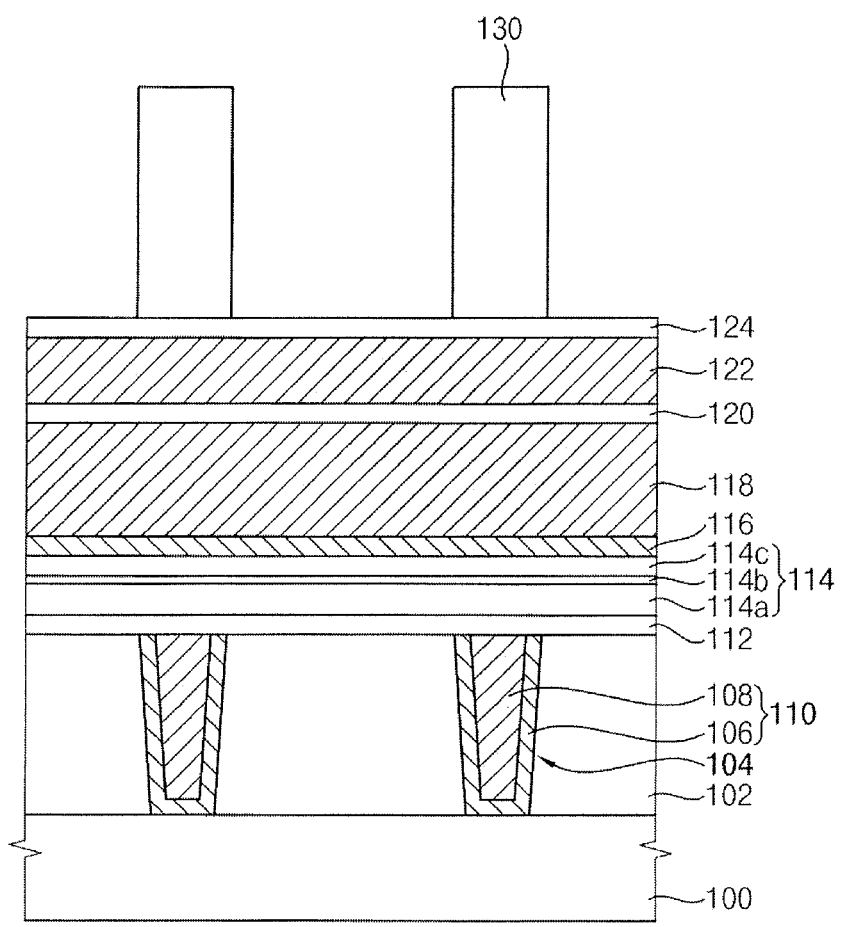

Referring to FIG. 5, the mold layer 126 may be removed. When the mold layer 126 includes SOH, the mold layer 126 may be removed by an ashing process. Thus, the second hard mask 130 may be formed on the adhesion layer 124. The second hard mask 130 may be formed by a damascene process, so that the second hard mask 130 having a small width may be formed.

In an implementation, the second hard mask 130 may be formed by an embossing process. For example, the second hard mask layer may be formed on the adhesion layer, and the second hard mask layer may be etched by a photolithography process to form the second hard mask.

Figure 6:
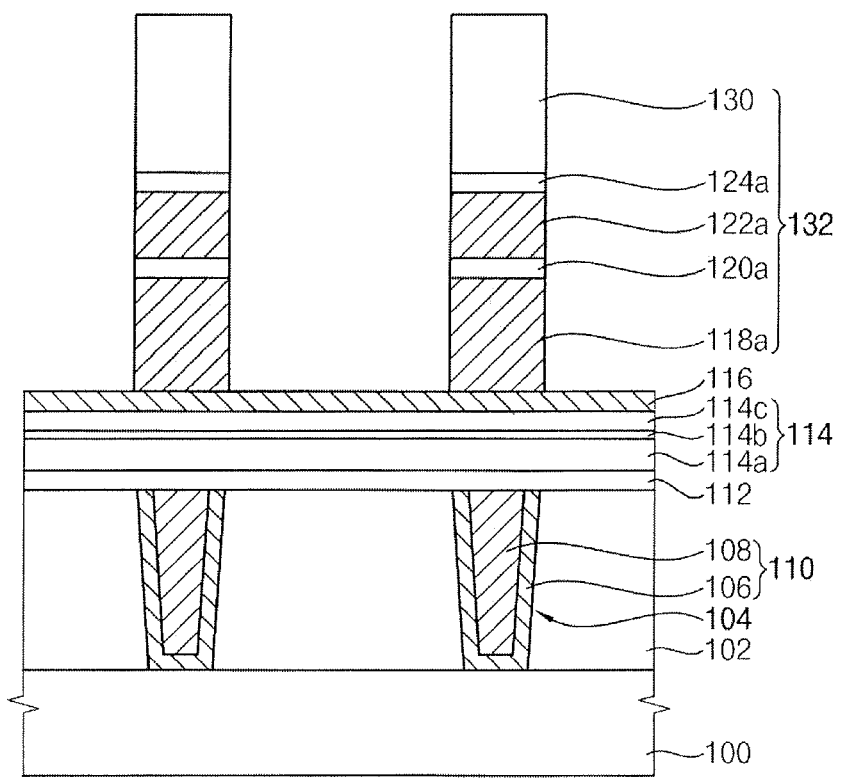

Referring to FIG. 6, the adhesion layer 124, the first hard mask layer 122, the first capping layer 120, and the upper electrode layer 118 may be anisotropically etched using the second hard mask 139 as an etching mask to form a mask structure 132. The mask structure 132 may include an upper electrode 118a, a first capping layer pattern 120a, a first hard mask 122a, an adhesion layer pattern 124a, and the second hard mask 130 sequentially stacked on the middle electrode layer 116. In the etching process, the second hard mask 130 may be partially removed.

Figure 7:
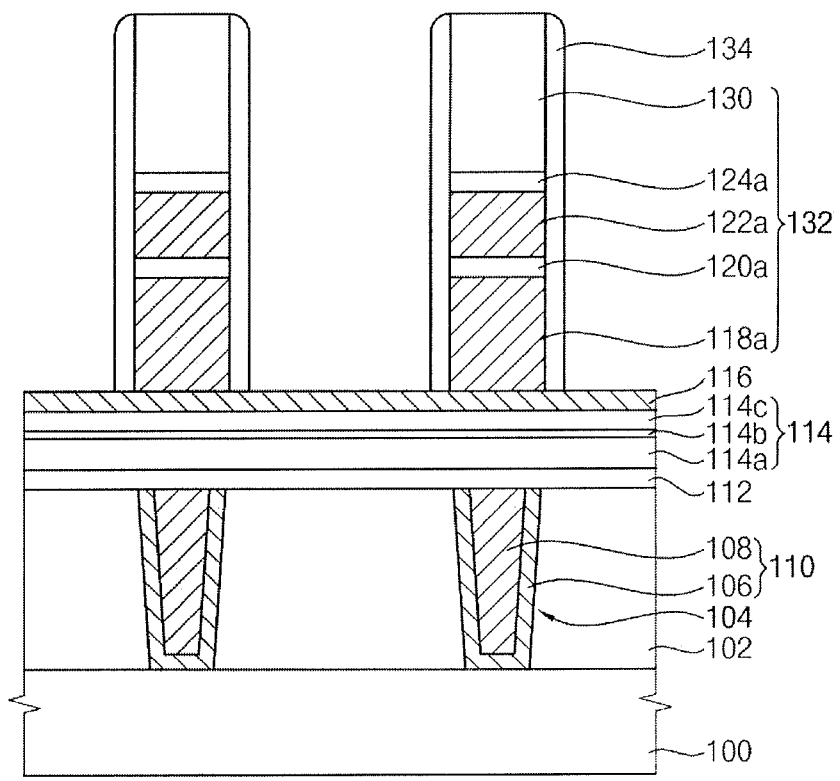

Referring to FIG. 7, a spacer layer may be formed on the mask structure 132 and the middle electrode layer 116. The spacer layer may be anisotropically etched to form a spacer 134 on a sidewall of the mask structure 132.

The spacer 134 may be formed of a material having a resistance that is higher than a resistance of the upper electrode 118a. In an implementation, the spacer 134 may be formed of an insulation material, e.g., silicon oxide.

In an implementation, the spacer 134 may include a material that is the same as or substantially the same as a material of the first capping layer pattern 120a. In an implementation, the spacer 134 may include a material that is different from the material of the first capping layer pattern 120a.

In an implementation, the materials of the spacer 134 and the middle electrode layer 116 may be different from each other.

Figure 8:
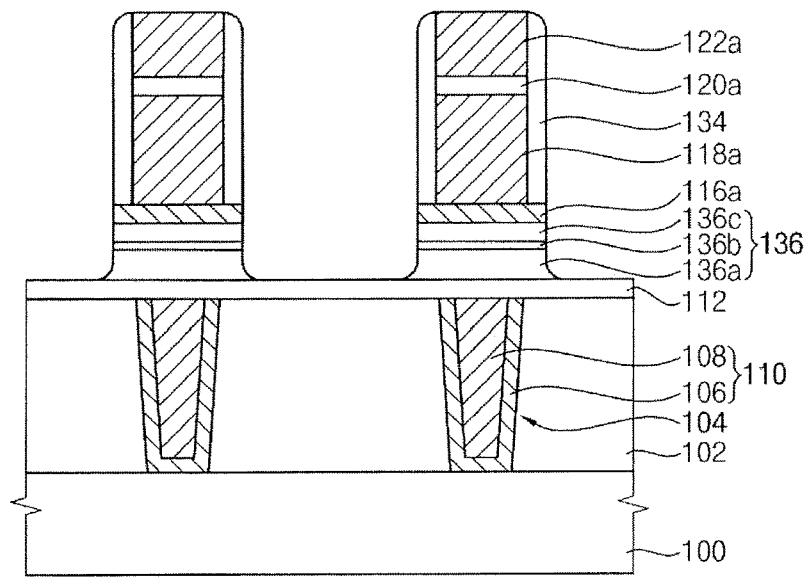
Figure 9:
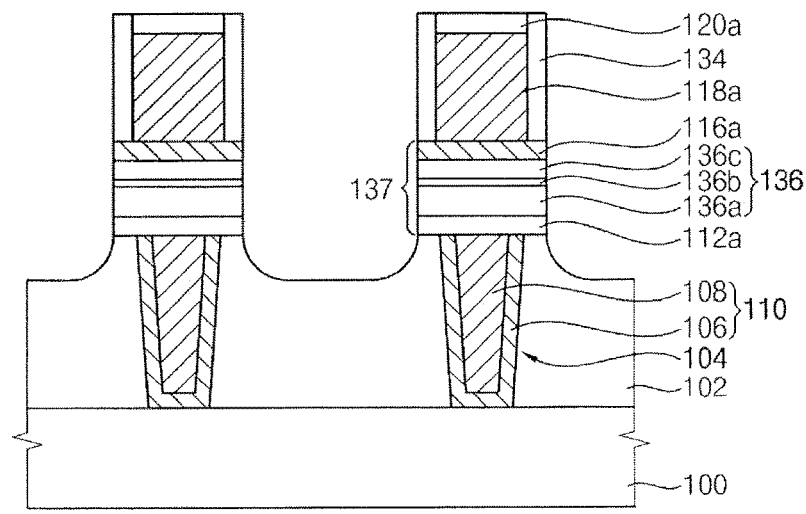

FIG. 8 shows a structure during an etching process for forming an MTJ structure, and FIG. 9 shows the MTJ structure after the etching process.

Referring to FIGS. 8 and 9, the middle electrode layer 116, the MTJ layer 114 and the lower electrode layer 112 may be sequentially etched using the mask structure 132 and the spacer 134 as an etching mask. Also, an upper surface of the first insulating interlayer 102 may be over etched.

The middle electrode layer 116, the MTJ layer 114, the lower electrode layer 112, and the first insulating interlayer 102 may be etched by a physical etching process, e.g., an ion beam etching (IBE) process. In an implementation, the etching process may include an argon ion sputtering etching process. In an implementation, in the etching process, an incidence angle of an ion beam serving as an etching source may be changeable.

A lower electrode 112a, an MTJ structure 136, and a middle electrode 116a may be formed on the lower electrode contact 110 by the etching process. A structure including the lower electrode 112a, the MTJ structure 136, and the middle electrode 116a sequentially stacked may have a pillar shape. The MTJ structure 136 may include a first magnetic pattern 136a, a tunnel barrier pattern 136b, and the second magnetic pattern 136c sequentially stacked.

As shown in FIG. 8, upper portions of the mask structure 132 and the spacer 134 may be also etched during the etching process.

As shown in FIG. 9, the first capping layer pattern 120a may remain on the upper electrode 118a after the etching process. In an implementation, the first hard mask 122a, the adhesion layer pattern 124a and the second hard mask 130 on the first capping pattern 120a may be removed.

When a first structure 137 including the lower electrode 112a, the MTJ structure 136, and the middle electrode 116a sequentially stacked is formed, the upper electrode 118a may not serve as an etching mask. For example, during the etching process for forming the first structure 137, the first and second hard masks 122a and 130 serving as an etching mask and the upper electrode 118a may be separated from each other.

The spacer 134 may be formed on the sidewall of the upper electrode 118a, and the first capping layer pattern 120a may be formed on an upper surface of the upper electrode 118a. Thus, after the etching process, the sidewall and upper surface of the upper electrode 118a may not be exposed by the spacer 134 and the first capping layer pattern 120a.

A width of the upper electrode 118a may be less than a width of the first structure 137. A width of the second structure including the upper electrode 118a and the spacer 134 on the sidewall of the upper electrode 118a may be substantially the same as the width of the first structure 137.

The surface of the upper electrode 118a may not be exposed during the etching process, so that a conductive by-product generated by etching the upper electrode 118a may decrease. Thus, the conductive by-product may not be re-deposited on a sidewall of the MTJ structure 136, and an undesirable electrical short of the MTJ structure due to the conductive by-product may decrease or be prevented.

As described above, the first hard mask 122a and the upper electrode 118a may be separate from each other. For example, the first capping layer pattern 120a may be formed between the first hard mask 122a and the upper electrode 118a. Thus, the middle electrode layer 116, the MTJ layer 114, the lower electrode layer 112, and the first insulating interlayer 102 may be etched using the first hard mask 122a (including a metal having a high strength) as the etching mask. During the etching process, the upper electrode 118a may not be damaged.

Referring to FIG. 10, a second capping layer 138 may be formed on the first structure 137, the spacer 134, the first capping layer pattern 120a, and the first insulating interlayer 102. The second capping layer 138 may directly contact a sidewall of the first structure 137, so that the second capping layer 138 may protect a sidewall of the MTJ structure 136 in the first structure 137. The second capping layer 138 may not directly contact the upper electrode 118a.

The second capping layer 138 may be formed of, e.g., silicon nitride. The second capping layer 138 may be formed by a CVD process or an ALD process.

A second insulating interlayer 140 may be formed on the second capping layer 138. The second insulating interlayer 140 may fill a gap between stacked structures including the first structure 137 and the upper electrode 118a. The second insulating interlayer 140 may be formed of, e.g., silicon oxide.

Figure 11:
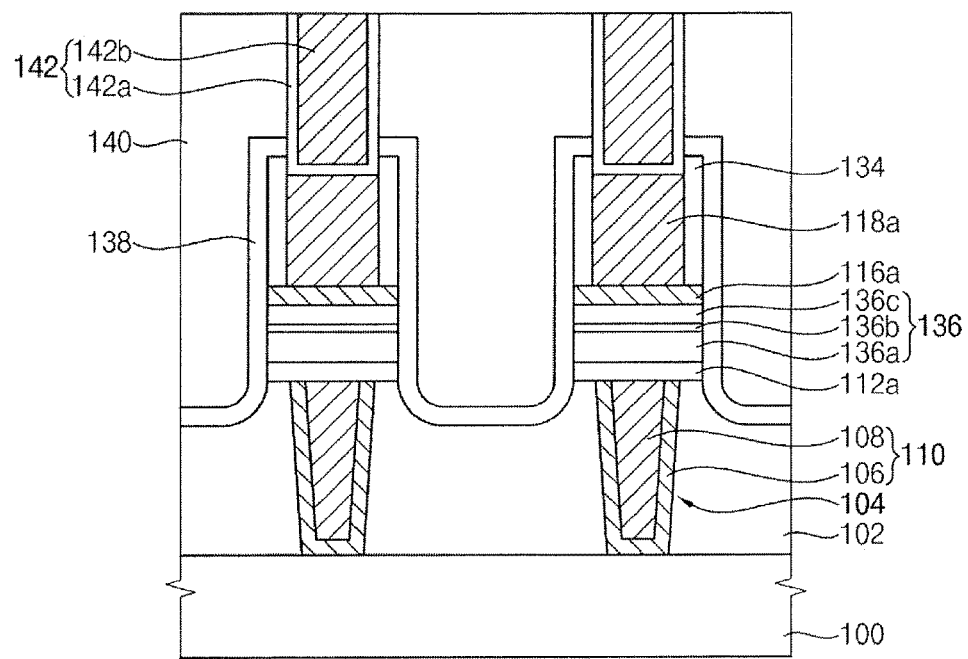

Referring to FIG. 11, the second insulating interlayer 140, the second capping layer 138, and the first capping layer pattern 120a may be etched to form a via hole exposing the upper surface of the upper electrode 118a. A via contact 142 may be formed to fill the via hole.

For example, a second barrier layer may be formed on the sidewall of the via hole, the upper surface of the upper electrode 118a, and the second insulating interlayer 140, and a metal layer may be formed on the second barrier layer to fill the via hole. The second barrier layer and the metal layer may be planarized until an upper surface of the second insulating interlayer 140 is exposed to form the via contact including a second barrier pattern 142a and the metal pattern 142b.

As described above, in the MRAM device, an electrical short of the MTJ structure may decrease or be prevented.

Figure 12:
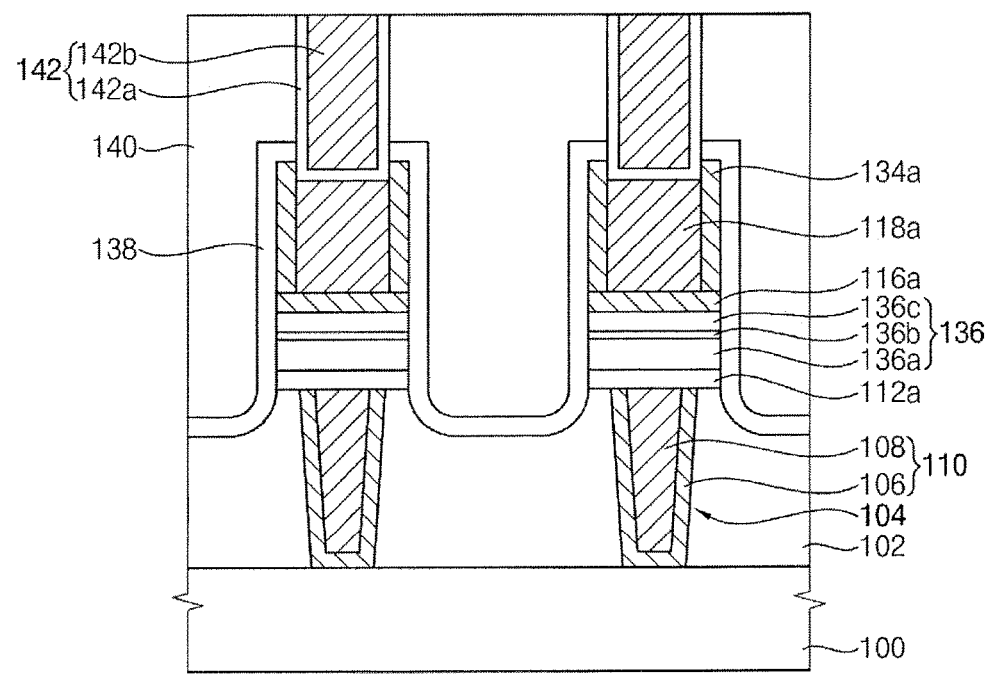
FIG. 12 illustrates a cross-sectional view of an MRAM device in accordance with example embodiments.

FIG. 12 illustrates a cross-sectional view of an MRAM device in accordance with example embodiments.

The MRAM device shown in FIG. 12 may be substantially the same as the MRAM device shown in FIG. 1, except for a material of a spacer on the sidewall of the upper electrode.

Referring to FIG. 12, the spacer 134a may include a material having a resistance that is higher than a resistance of the upper electrode 118a. In an implementation, the spacer 134a may include a conductive material, e.g., a metal or a metal nitride. A conductive material included in the spacer 134a may be an insulation material when it is oxidized. The conductive material may be hardly re-deposited, during a subsequent etching process. In an implementation, the spacer 134a may include, e.g., tantalum, titanium, tantalum nitride, titanium nitride, etc.

Figure 13:
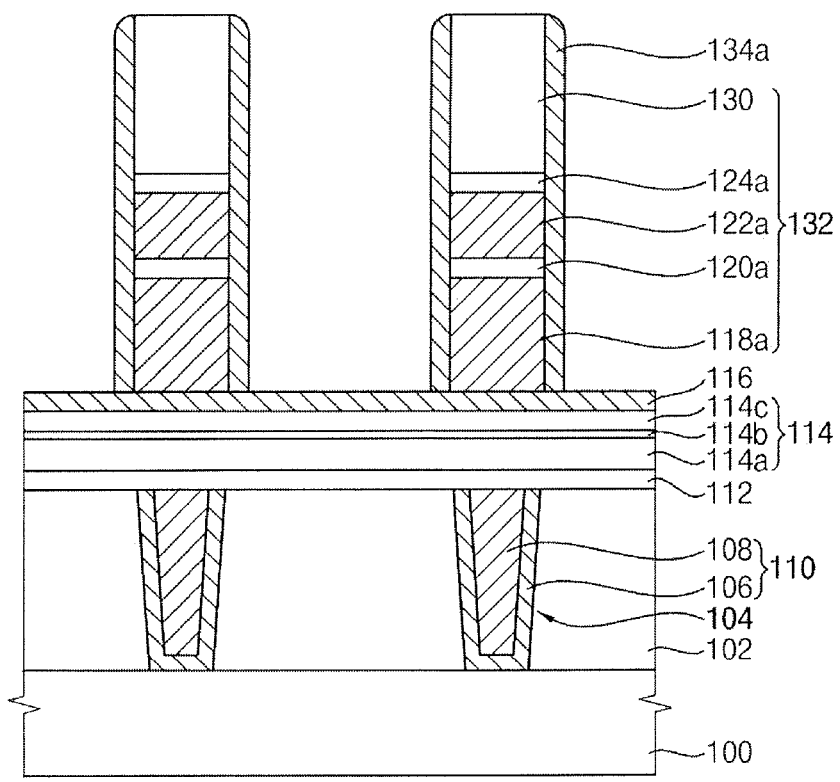
FIGS. 13 to 15 illustrate cross-sectional views of stages in a method of manufacturing an MRAM device in accordance with example embodiments.
Figure 14:
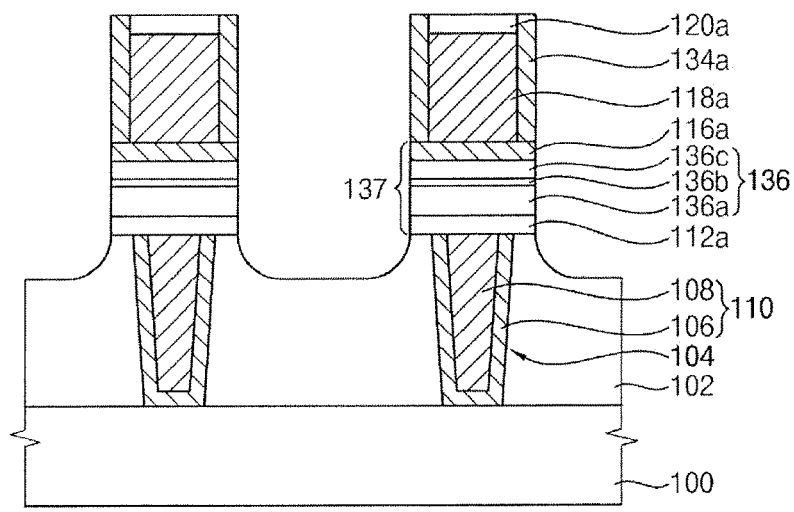
Figure 15:
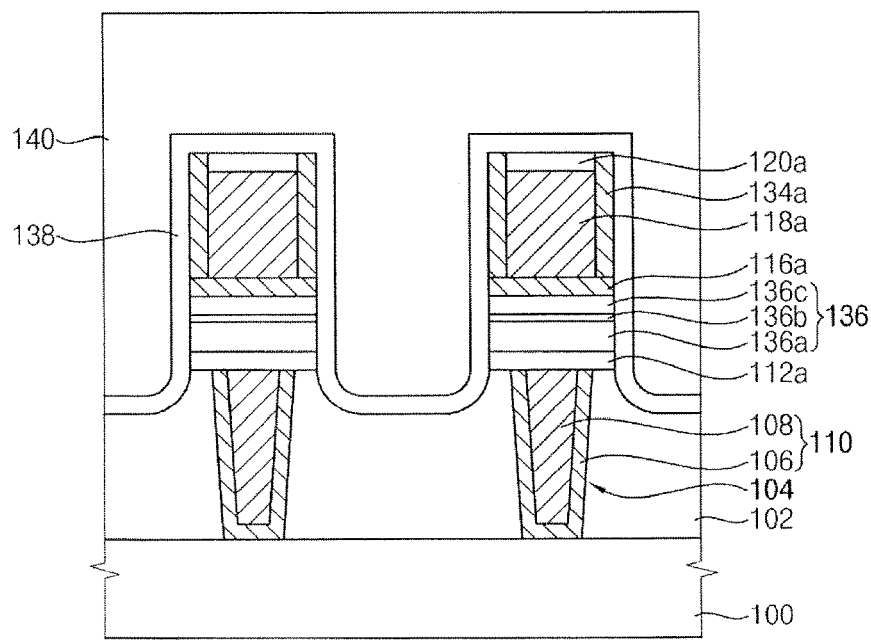

FIGS. 13 to 15 illustrate cross-sectional views of stages in a method of manufacturing an MRAM device in accordance with example embodiments.

Referring to FIG. 13, first, processes substantially the same as or similar to those illustrated with reference to FIGS. 2 to 6 may be performed to form the mask structure 132 including the upper electrode 118a, the first capping layer pattern 120a, the first hard mask 122a, the adhesion layer pattern 124a, and the second hard mask 130 stacked on the middle electrode layer 116.

A spacer layer may be formed on the mask structure 132 and the middle electrode 116. The spacer layer may be anisotropically etched to form the spacer 134a on a sidewall of the mask structure 132.

The spacer 134a may be formed of a material having a resistance that is higher than that of the upper electrode 118a. A metal included in the spacer 134a may be an insulating material when it is oxidized. The metal included in the spacer 134a may be hardly re-deposited, during a subsequent etching process. In an implementation, the spacer 134a may include a metal, e.g., tantalum, titanium or a metal nitride, e.g., tantalum nitride, titanium nitride, etc.

In an implementation, the first capping layer pattern 120a may include an insulation material. In this case, a material of the spacer 134a may be different from a material of the first capping layer pattern 120a. In an implementation, the spacer 134a may include a metal or a metal nitride that is substantially the same as that of the middle electrode layer 116. In an implementation, the spacer 134a may include a metal or a metal nitride that is different from that of the middle electrode layer 116.

Referring to FIG. 14, the middle electrode layer 116, the MTJ layer 114, and the lower electrode layer 112 may be sequentially etched using the mask structure 132 and the spacer 134a as an etching mask. In an implementation, an upper surface of the first insulating interlayer 102 may be over etched.

The etching processes of the middle electrode layer 116, the MTJ layer 114, the lower electrode layer 112, and the first insulating interlayer 102 may be substantially the same as processes illustrated with reference to FIGS. 8 to 9.

Thus, the first structure 137 including the lower electrode 112a, the MTJ structure 136, and the middle electrode 116a may be formed on the lower electrode contact 110. The upper electrode 118a may be formed on the first structure 137. The spacer 134a may be formed on a sidewall of the upper electrode 118a, and the first capping layer pattern 120a may be formed on an upper surface of the upper electrode 118a.

Referring to FIG. 15, the second capping layer 138 may be formed on the first structure 137, the spacer 134a, the first capping layer pattern 120a, and the first insulating interlayer 102. The processes for forming the second capping layer 138 may be substantially the same as processes illustrated with reference to FIG. 10. The second insulating interlayer 140 may be formed on the second capping layer 138.

Referring to FIG. 12 again, the second insulating interlayer 140, the second capping layer 138 and the first capping layer pattern 120a may be etched to form a via hole exposing the upper surface of the upper electrode 118a. The via contact 142 may be formed to fill the via hole. Processes for forming the via contact 142 may be substantially the same as processes illustrated with reference to FIG. 11.

FIGS. 16 to 19 illustrate cross-sectional views of stages in a method of manufacturing an MRAM device in accordance with example embodiments.

Figure 16:
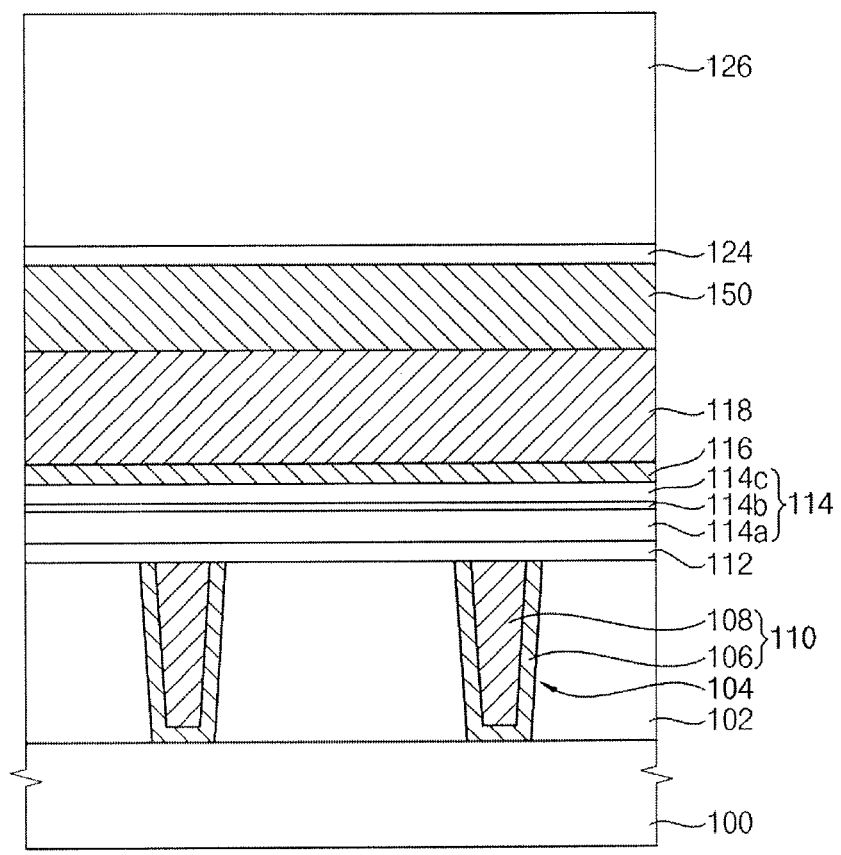
FIGS. 16 to 19 illustrate cross-sectional views of stages in a method of manufacturing an MRAM device in accordance with example embodiments.

Referring to FIG. 16, first, processes substantially the same as or similar to those illustrated with reference to FIG. 2 may be performed to form the first insulating interlayer 102 and the lower electrode contact 110 extending through the first insulating interlayer 102.

The lower electrode layer 112, the MTJ layer 114, and the middle electrode layer 116 may be sequentially formed on the first insulating interlayer 102 and the lower electrode contact 110. The upper electrode layer 118, a first hard mask layer 150, the adhesion layer 124, and the mold layer 126 may be sequentially formed on the middle electrode layer 116.

The lower electrode layer 112, the MTJ layer 114, and the middle electrode layer 116 may be substantially the same as the lower electrode layer, the MTJ layer, and the middle electrode layer, respectively, illustrated with reference to FIG. 3.

The upper electrode layer 118 and the first hard mask layer 150 may directly contact each other. For example, a first capping layer may not be formed between the upper electrode layer 118 and the first hard mask layer 150. The first hard mask layer 150 may include a material that is different from a material of the upper electrode layer 118. In an implementation, the first hard mask layer 150 may include a metal, e.g., tantalum, titanium, etc, and/or a metal nitride, e.g., tungsten nitride, tantalum nitride, etc. In an implementation, the first hard mask layer 150 may include a metal or a metal nitride that is substantially the same as that of the middle electrode layer 116. In an implementation, the first hard mask layer 150 may include a metal or a metal nitride that is different from that of the middle electrode layer 116.

Figure 17:
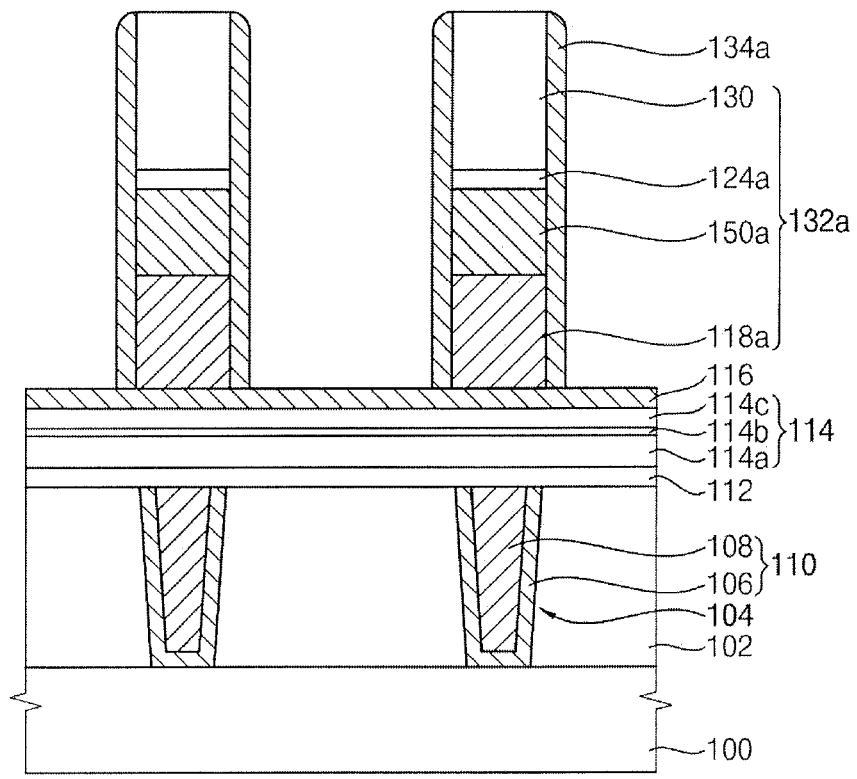

Referring to FIG. 17, processes substantially the same as or similar to those illustrated with reference to FIGS. 4 and 5 may be performed to form the second hard mask 130 on the adhesion layer 124.

The adhesion layer 124, the first hard mask layer 150, and the upper electrode layer 118 may be anisotropically etched using the second hard mask 130 as an etching mask to form a mask structure 132a including the upper electrode 118a, the first hard mask 150a, the adhesion layer pattern 124a, and the second hard mask 130 sequentially stacked on the middle electrode layer 116.

A spacer layer may be formed on the mask structure 132a and the middle electrode layer 116. The spacer layer may be anisotropically etched to form the spacer 134a on a sidewall of the mask structure 132a.

The spacer 134a may include a material having a resistance that is higher than a resistance of the upper electrode 118a.

In an implementation, the spacer 134a may include a metal, e.g., tantalum, titanium, etc, and/or a metal nitride, e.g., tungsten nitride, tantalum nitride, etc. In this case, an MRAM shown in FIG. 12 may be manufactured by subsequent processes.

In an implementation, the spacer 134a may include an insulation material. In this case, an MRAM shown in FIG. 1 may be manufactured by subsequent processes.

Figure 18:
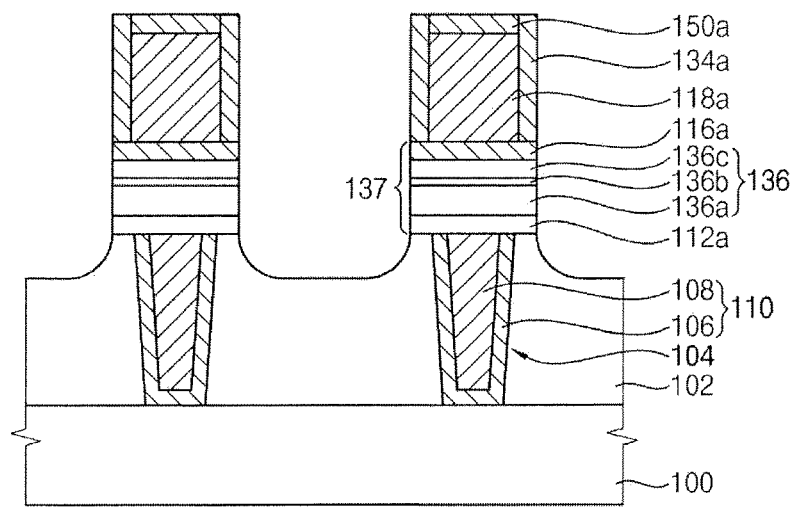

Referring to FIG. 18, the middle electrode layer 116, the MTJ layer 114, and the lower electrode layer 112 may be sequentially etched using the mask structure 132a and the spacer 134a as an etching mask. Also, an upper surface of the first insulating interlayer 102 may be over etched.

Thus, the first structure 137 including the lower electrode 112a, the MTJ structure 136, and the middle electrode 116a may be formed on the lower electrode contact 110. After etching process, the second hard mask 130 and the adhesion layer pattern 124a may be removed. In an implementation, the first hard mask may partially remain on the upper electrode. The first hard mask may serve as a first capping layer pattern 150a covering an upper surface of the upper electrode 118a.

For example, the spacer 134a may be formed on the sidewall of the upper electrode 118a, and the first capping layer pattern 150a may be formed on the upper surface of the upper electrode 118a.

Figure 19:
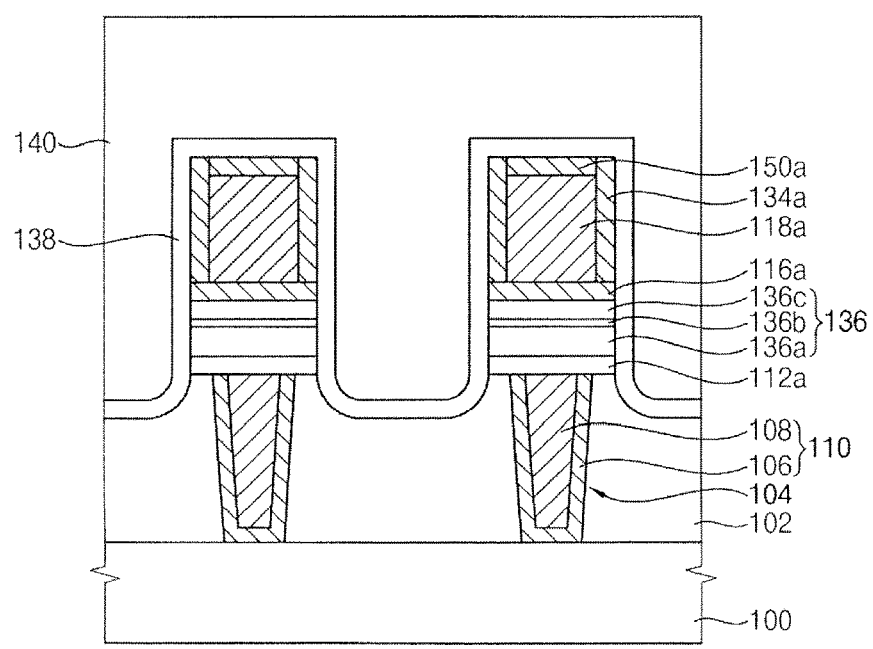

Referring to FIG. 19, the second capping layer 138 may be formed on the first structure 137, the spacer 134a, the first capping layer pattern 150a, and the first insulating interlayer 102. The second insulating interlayer 140 may be formed on the second capping layer 138.

The second capping layer 138 and the second insulating interlayer 140 may be formed by processes substantially the same as processes illustrated with reference to FIG. 10.

The second insulating interlayer 140, the second capping layer 138, and the first capping layer pattern 150a may be etched to form a via hole exposing the upper surface of the upper electrode 118a. The via contact 142 (refer to FIG. 12 or FIG. 1) may be formed to fill the via hole.

As described above, an MRAM shown in FIG. 12 or FIG. 1 may be manufactured.

FIGS. 20 to 23 illustrate cross-sectional views of stages in a method of manufacturing an MRAM device in accordance with example embodiments.

Figure 20:
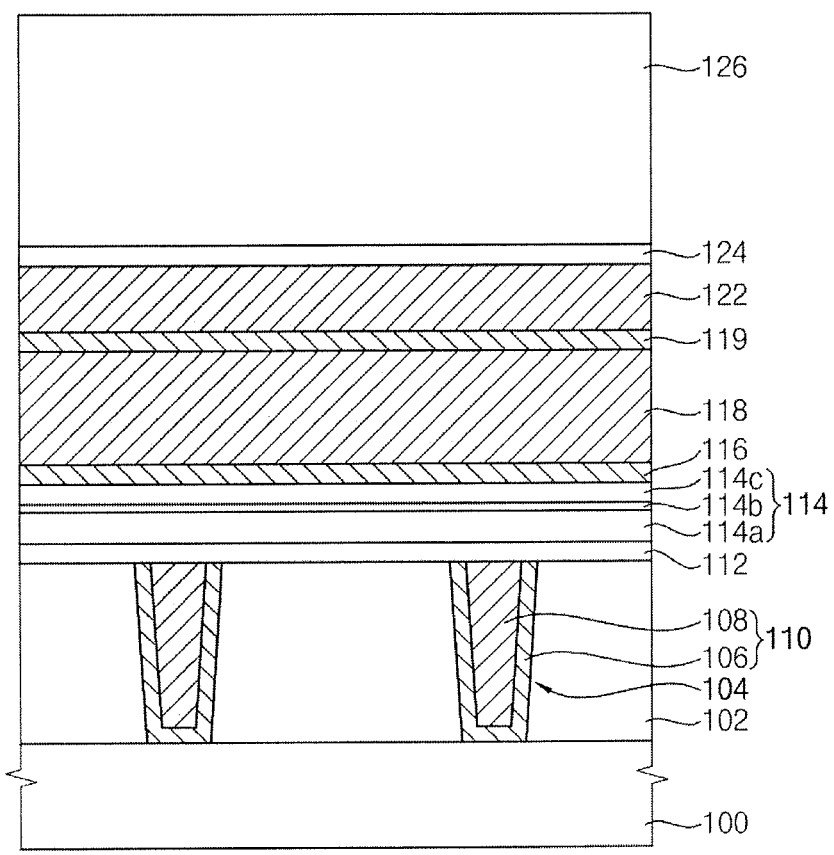
FIGS. 20 to 23 illustrate cross-sectional views of stages in a method of manufacturing an MRAM device in accordance with example embodiments.

Referring to FIG. 20, first, processes substantially the same as or similar to those illustrated with reference to FIG. 2 may be performed to form the first insulating interlayer 102 and the lower electrode contact 110 extending through the first insulating interlayer 102.

The lower electrode layer 112, the MTJ layer 114, and the middle electrode layer 116 may be sequentially formed on the first insulating interlayer 102 and the lower electrode contact 110. The upper electrode layer 118, a first capping layer 119, the first hard mask layer 122, the adhesion layer 124, and the mold layer 126 may be sequentially formed on the middle electrode layer.

The lower electrode layer 112, the MTJ layer 114, and the middle electrode layer 116 may be substantially the same as the lower electrode layer, the MTJ layer, and the middle electrode layer, respectively, illustrated with reference to FIG. 3. The upper electrode layer 118, the adhesion layer 124, the first hard mask layer 122, and the mold layer 126 may be substantially the same as the upper electrode layer, the adhesion layer, the first hard mask layer, and the mold layer, respectively, illustrated with reference to FIG. 3.

The first capping layer 119 may be formed of a conductive material having a resistance higher than a resistance of the upper electrode layer 118. The first capping layer 119 may include a metal, e.g., tantalum, titanium, etc, and/or a metal nitride, e.g., tungsten nitride, tantalum nitride, etc.

In an implementation, the first capping layer 119 may include a metal or a metal nitride that is substantially the same as that of the middle electrode layer 116. In an implementation, the first capping layer 119 may include a metal or a metal nitride that is different from that of the middle electrode layer 116.

Figure 21:
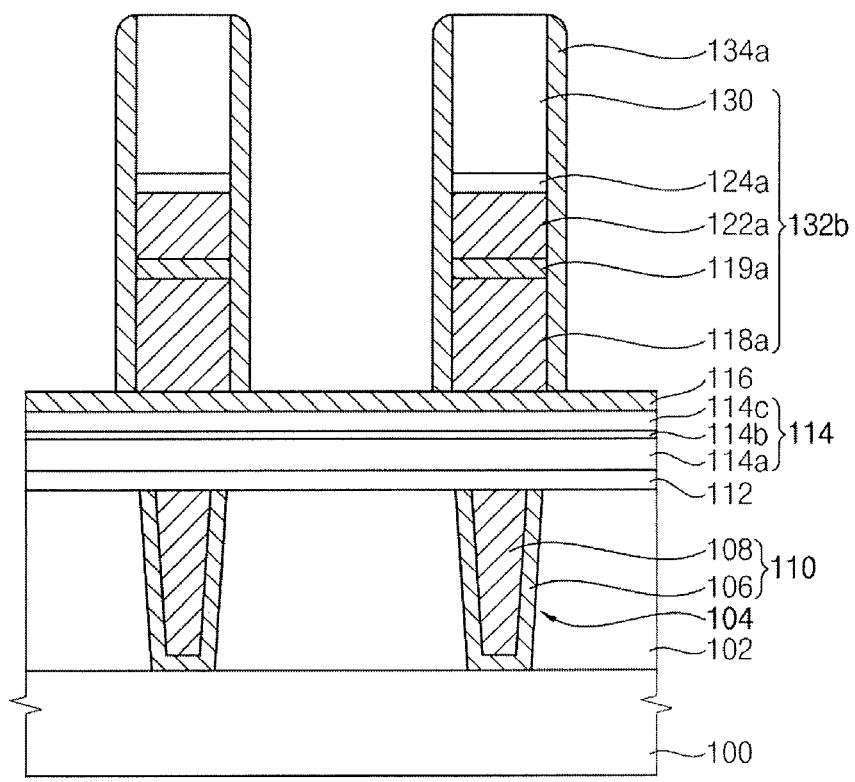

Referring to FIG. 21, the second hard mask 130 may be formed on the adhesion layer 124 by performing processes substantially the same as processes illustrated with reference to FIGS. 4 and 5.

The adhesion layer 124, the first hard mask layer 122, the first capping layer 119, and the upper electrode layer 118 may be anisotropically etched using the second hard mask 130 as an etching mask to form a mask structure 132b including the upper electrode 118a, the first hard mask 122a, the adhesion layer pattern 124a, and the second hard mask 130 sequentially stacked on the middle electrode layer 116.

A spacer layer may be formed on the mask structure 132b and the middle electrode layer 116. The spacer layer may be anisotropically etched to form the spacer 134a on a sidewall of the mask structure 132b.

The spacer 134a may be formed of a conductive material having a resistance that is higher than a resistance of the upper electrode 118a. In an implementation, the spacer 134a may include a metal, e.g., tantalum, titanium, etc, and/or a metal nitride, e.g., tungsten nitride, tantalum nitride, etc.

In an implementation, the spacer 134a may include a metal or a metal nitride that is substantially the same as that of the first capping layer 119. In an implementation, at least one of the first capping layer, the middle electrode layer, and the spacer may include different metals or metal nitrides.

Figure 22:
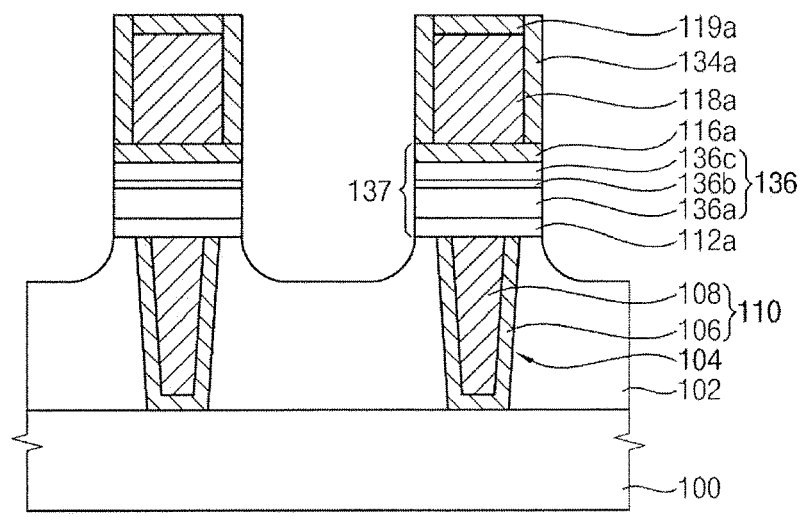

Referring to FIG. 22, the middle electrode layer 116, the MTJ layer 114, and the lower electrode layer 112 may be sequentially etched using the mask structure 132a and the spacer 134a as an etching mask. Also, an upper surface of the first insulating interlayer 102 may be over etched.

The etching processes of the middle electrode layer 116, the MTJ layer 114, the lower electrode layer 112, and the first insulating interlayer 102 may be substantially the same as processes illustrated with reference to FIGS. 8 to 9.

Thus, the first structure 137 including the lower electrode 112a, the MTJ structure 136, and the middle electrode 116a may be formed on the lower electrode contact 110. The upper electrode 118a may be formed on the first structure 137. The spacer 134a including a metal or a metal nitride may be formed on a sidewall of the upper electrode 118a, and the first capping layer pattern 119a including a metal or a metal nitride may be formed on an upper surface of the upper electrode 118a.

Figure 23:
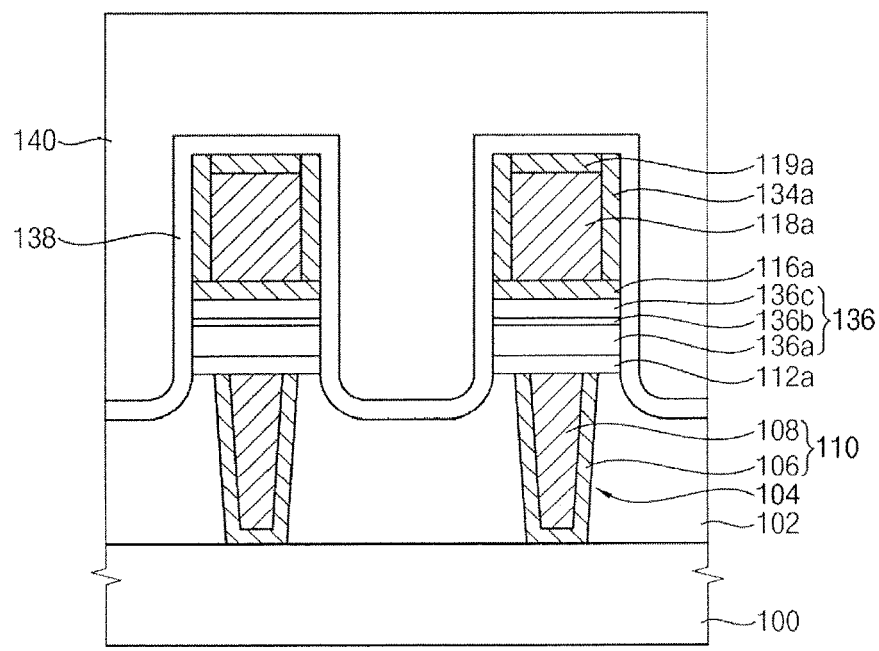

Referring to FIG. 23, the second capping layer 138 may be formed on the first structure 137, the spacer 134a, the first capping layer pattern 119a, and the first insulating interlayer 102. The second insulating interlayer 140 may be formed on the second capping layer 138.

The second insulating interlayer 140, the second capping layer 138, and the first capping layer pattern 119a may be etched to form a via hole exposing the upper surface of the upper electrode 118a. The via contact 142 (refer to FIG. 12) may be formed to fill the via hole.

As described above, the MRAM device shown in FIG. 12 may be manufactured.

FIGS. 24 to 28 illustrate cross-sectional views of stages in a method of manufacturing an MRAM device in accordance with example embodiments.

The MRAM device may include lower elements, e.g., a transistor, a wiring, etc.

Figure 24:
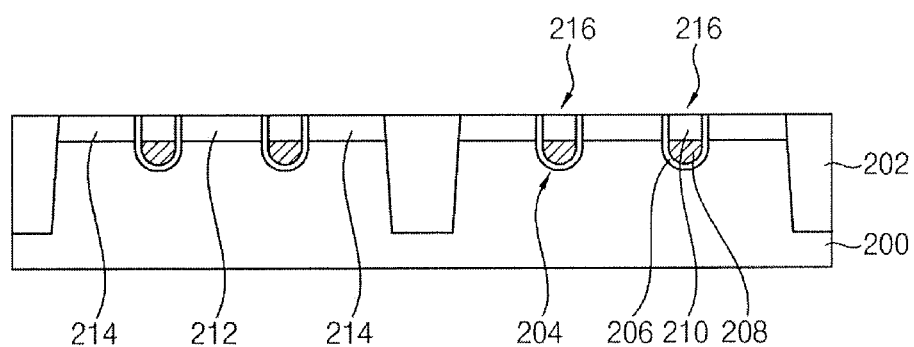
FIGS. 24 to 28 illustrate cross-sectional views of stages in a method of manufacturing an MRAM device in accordance with example embodiments.

Referring to FIG. 24, an isolation layer 202 may be formed on a substrate 200, and thus an active region and a field region may be defined in the substrate 200. The isolation layer 202 may be formed by a shallow trench isolation (STI) process. A plurality of active regions may be spaced apart from each other, and may be regularly arranged.

A plurality of transistors 216 may be formed on the substrate 200.

In an implementation, a mask may be formed on the substrate 200. The substrate 200 may be etched using the mask to form a plurality of trenches 204 extending (e.g., lengthwise) in a first direction. In an implementation, each of the active regions may include two trenches 204 thereon. A gate structure may be formed to fill each of the trenches 204, and the gate structure may include a gate insulation pattern 206, a gate electrode 208, and a hard mask 210 sequentially stacked. Impurities may be doped into portions of the active region adjacent the gate structure to form a source region 212 and a drain region 214. The source region 212 may be commonly used in adjacent two transistors. Thus, a buried gate type transistor may be formed on the substrate 200.

Figure 25:
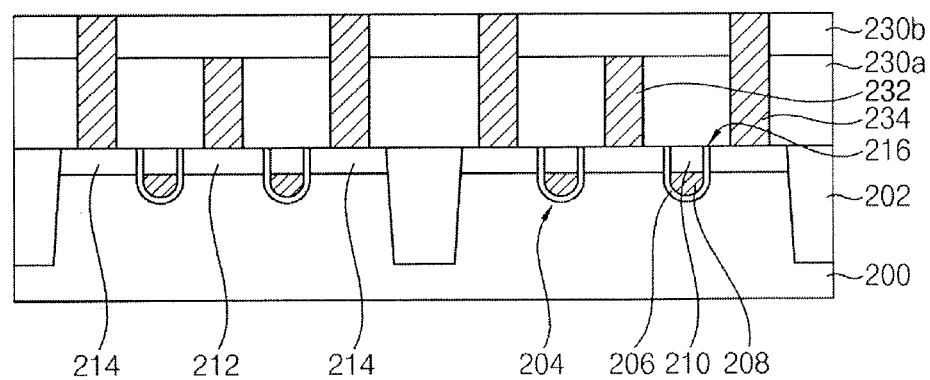

Referring to FIG. 25, a first lower insulating interlayer 230a may be formed on the substrate 200. The first lower insulating interlayer 230a may be partially etched to form a first opening exposing the source region 212. A first conductive layer may be formed to fill the first opening, and the first conductive layer may be planarized to form a source line 232 contacting the source region 212.

A second lower insulating interlayer 230b may be formed on the first lower insulating interlayer 230a and the source line 232.

A second opening exposing the drain region 214 may be formed through the first and second lower insulating interlayers 230a and 230b. A second conductive layer may be formed to fill the second opening, and the second conductive layer may be planarized to form a contact plug 234 contacting the drain region 214.

Figure 26:
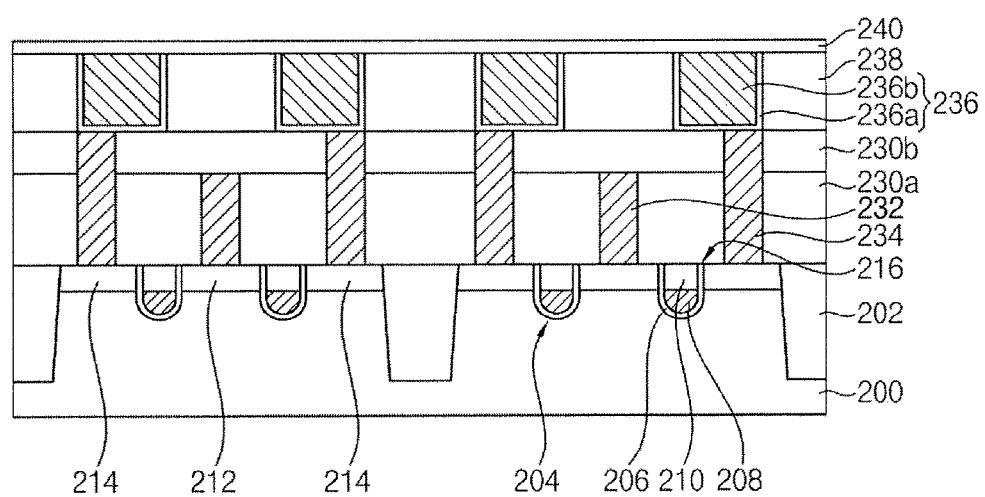

Referring to FIG. 26, a third lower insulating interlayer 238 may be formed on the second lower insulating interlayer 230b. A first wiring structure 236 may be formed on the contact plug 234 through the third lower insulating interlayer 238. An etch stop layer 240 may be formed on the third lower insulating interlayer 238 and the first wiring structure 236.

The third lower insulating interlayer 238 may be formed by a CVD process, an ALD process, or a spin coating process.

The first wiring structure 236 may include a barrier layer 236a and a metal pattern 236b.

In an implementation, the first wiring structure 236 may be formed by a dual damascene process or a single damascene process. In this case, the metal pattern 236b may include, e.g., copper. In an implementation, the first wiring structure 236 may be formed by a photolithography process. In this case, the metal pattern 236b may include, e.g., tungsten, aluminum, etc.

In an implementation, the etch stop layer 240 may be formed of, e.g., silicon nitride or silicon oxynitride by a CVD process or an ALD process.

Figure 27:
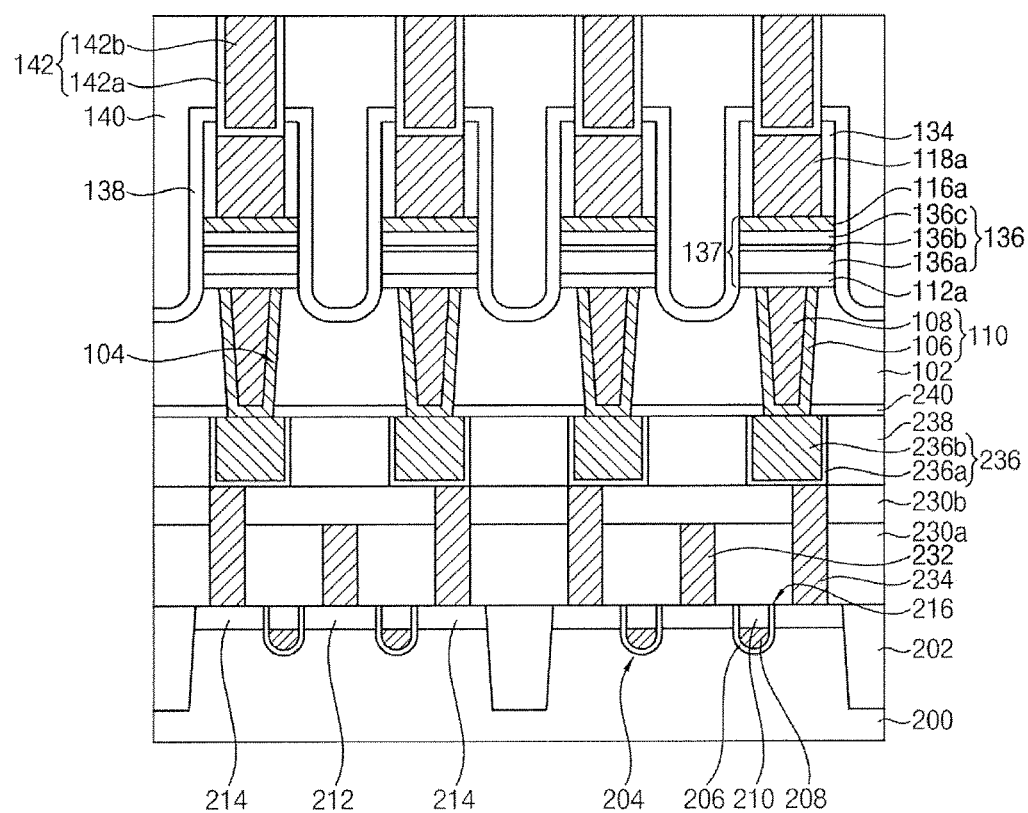

Referring to FIG. 27, a structure shown in FIG. 1 or FIG. 12 may be formed on the etch stop layer and the wiring structure.

In an implementation, processes substantially the same as or similar to those illustrated with reference to FIGS. 1 to 11 may be performed to form the structure shown in FIG. 1 on the etch stop layer 240 and the wiring structure 236. In an implementation, processes substantially the same as or similar to processes illustrated with reference to FIGS. 13 to 15, FIGS. 16 to 19 or FIGS. 20 to 23 may be performed to form the structure shown in FIG. 12 on the etch stop layer 240 and the wiring structure 236.

For example, the first insulating interlayer 102 may be formed on the etch stop layer 240. The lower electrode contact 110 extending through the first insulating interlayer 102 and the etch stop layer 240 may be formed on the wiring structure 236.

The first structure 137 including the lower electrode 112a, the MTJ structure 136, and the middle electrode 116a may be formed on the lower electrode contact 110. The upper electrode 118a may be formed on the first structure 137. The spacer 134 may be formed on a sidewall of the upper electrode 118a, and the first capping layer pattern 120a may be formed on an upper surface of the upper electrode 118a. The second insulating interlayer 140 may be formed on the second capping layer 138, and the via contact 142 extending through the second insulating interlayer 140 may be formed on the upper electrode 118a.

Figure 28:
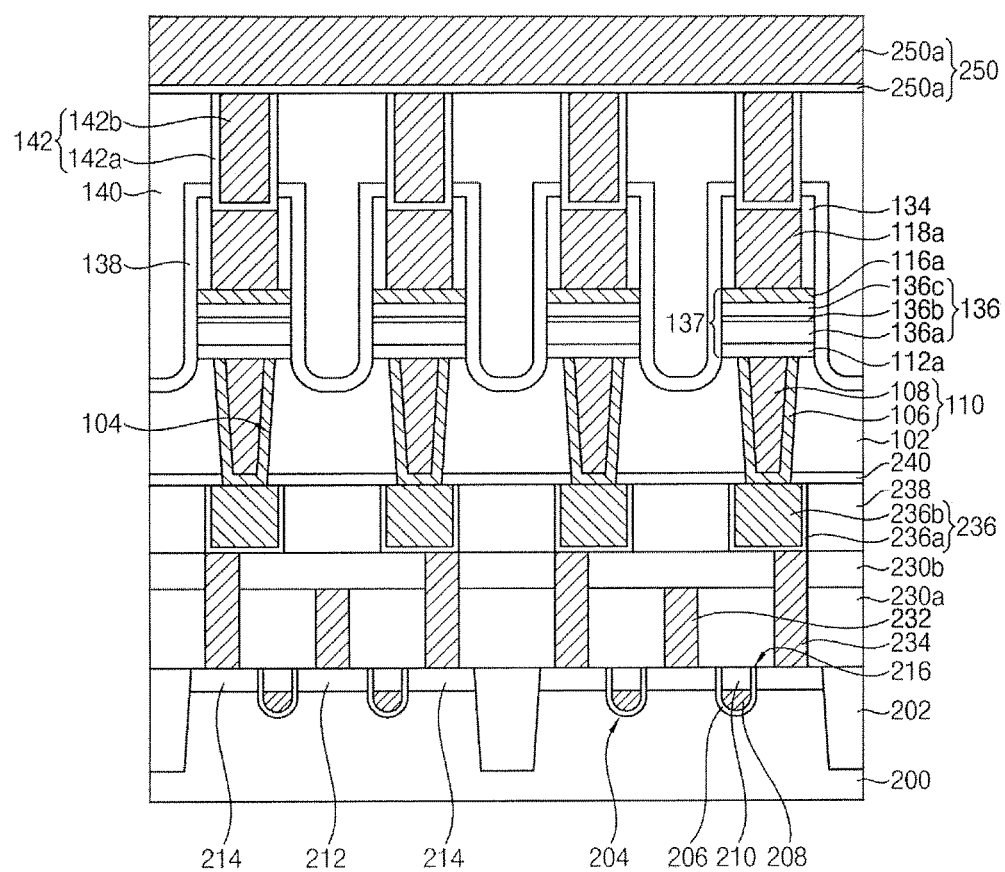

Referring to FIG. 28, a bit line 250 may be formed on the second insulating interlayer 140 and the via contact 142.

For example, a third insulating interlayer may be formed on the second insulating interlayer 140. The third insulating interlayer may be etched to form a trench for forming a bit line 250. The bit line 250 may be formed to fill the trench. The bit line 250 may be formed by forming a barrier layer on an inner wall of the trench, forming a metal layer on the barrier layer to fill the trench, and planarizing the metal layer and the barrier layer. The bit line 250 may include a barrier pattern 250a and a metal pattern 250b. The bit line 250 may be electrically connected with the upper electrode 118a by the via contact 142.

Then, an upper insulating interlayer may be further formed on the third insulating interlayer and the bit line 250.

The MRAM device in accordance with example embodiments may be used in a memory device included in an electronic product such as a mobile device, a memory card, and a computer.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, during a physical etching process, conductive layers in the MTJ layer may also be etched, and thus elements of the etched conductive layers may be re-deposited on a sidewall of the MTJ structure, which could generate an electrical short.

The embodiments may provide a method of manufacturing an MRAM device having improved characteristics.

In the MRAM device in accordance with example embodiments, an electrical short due to a re-deposition of a conductive by-product may decrease or be prevented. Thus, the MRAM device may have good characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a magnetoresistive random access memory (MRAM) device, the method comprising:
    forming a first insulating interlayer and a lower electrode contact on a substrate such that the lower electrode contact extends through the first insulating interlayer;
    sequentially forming a lower electrode layer, a magnetic tunnel junction layer, an upper electrode layer, and a first hard mask layer on the first insulating interlayer and the lower electrode contact;
    forming a second hard mask on the first hard mask layer;
    etching the first hard mask layer and the upper electrode layer using the second hard mask as an etching mask to form a first hard mask and an upper electrode, respectively;
    forming a spacer on sidewalls of the upper electrode, the first hard mask, and the second hard mask; and etching the magnetic tunnel junction layer and the lower electrode layer using the first hard mask, the second hard mask, and the spacer as an etching mask to form a structure including a lower electrode and a magnetic tunnel junction pattern on the lower electrode contact,
wherein at least one layer remains on the upper electrode after etching the magnetic tunnel junction layer and the lower electrode layer, and
wherein etching the magnetic tunnel junction layer and the lower electrode layer using the first and second hard masks and the spacer as the etching mask includes removing the second hard mask.

2. The method as claimed in claim 1, further comprising forming a first capping layer between the upper electrode layer and the first hard mask layer.

3. The method as claimed in claim 2, wherein:
the first capping layer includes an insulation material, a metal, or a metal nitride, and
the first capping layer has a resistance that is higher than a resistance of the upper electrode layer.

4. The method as claimed in claim 2, wherein the first capping layer includes silicon oxide, tantalum, titanium, tantalum nitride, or titanium nitride.

5. The method as claimed in claim 2, wherein the upper electrode layer includes a metal that is substantially the same as a metal of the first hard mask layer.

6. The method as claimed in claim 2, wherein etching the magnetic tunnel junction layer and the lower electrode layer using the first and second hard masks and the spacer as the etching mask further includes removing the first hard mask and forming a first capping layer pattern on the upper electrode.

7. The method as claimed in claim 1, wherein:
the upper electrode layer includes a metal that is different from a metal of the first hard mask layer, and
the first hard mask layer has a resistance that is higher than a resistance of the upper electrode layer.

8. The method as claimed in claim 7, wherein:
the upper electrode layer includes tungsten, and
the first hard mask layer includes tantalum, titanium, tantalum nitride, or titanium nitride.

9. The method as claimed in claim 7, wherein, after etching the magnetic tunnel junction layer and the lower electrode layer using the first hard mask, the second hard mask, and the spacer as the etching mask, the first hard mask remains on the upper electrode.

10. The method as claimed in claim 1, wherein:
the spacer includes an insulation material, a metal, or a metal nitride, and
the spacer has a resistance that is higher than a resistance of the upper electrode layer.

11. The method as claimed in claim 10, wherein the spacer includes silicon oxide, tantalum, titanium, tantalum nitride, or titanium nitride.

12. The method as claimed in claim 1, wherein etching the first hard mask layer and the upper electrode layer to form the first hard mask and the upper electrode, respectively, includes forming a plurality of upper electrodes, and
wherein the method further comprises:
forming a second capping layer on the spacer, the structure, the first insulating interlayer, and the at least one layer remaining on each of the plurality of upper electrodes;
forming a second insulating interlayer on the second capping layer to fill a gap between the plurality of upper electrodes; and
forming a via contact on each of the plurality of upper electrodes such that the via contact extends through the second insulating interlayer.

13. The method as claimed in claim 12, wherein:
the second capping layer directly contacts the spacer, the structure, and the first insulating interlayer, and
the second capping layer does not directly contact the plurality of upper electrodes.

14. The method as claimed in claim 12, wherein the second capping layer includes silicon nitride.

15. A method of manufacturing a magnetoresistive random access memory (MRAM) device, the method comprising:
forming a first insulating interlayer and a lower electrode contact on a substrate such that the lower electrode contact extends through the first insulating interlayer;
sequentially forming a lower electrode layer, a magnetic tunnel junction layer, an upper electrode layer, a first capping layer, and a first hard mask layer on the first insulating interlayer and the lower electrode contact;
forming a second hard mask on the first hard mask layer;
etching the first hard mask layer, the first capping layer, and the upper electrode layer using the second hard mask as an etching mask to form a first hard mask, a first capping layer pattern, and an upper electrode, respectively;
forming a spacer on sidewalls of the upper electrode, the first capping layer pattern, and the first and second hard masks; and
etching the magnetic tunnel junction layer and the lower electrode layer using the first hard mask, the second hard mask, and the spacer as an etching mask to form a structure including a lower electrode and a magnetic tunnel junction pattern on the lower electrode contact,
wherein the first capping layer pattern remains on the upper electrode after etching the magnetic tunnel junction layer and the lower electrode layer.

16. The method as claimed in claim 15, wherein:
each of the first capping layer and the spacer includes an insulation material, a metal, or a metal nitride, and
each of the first capping layer and the spacer has a resistance that is higher than a resistance of the upper electrode layer.

17. The method as claimed in claim 15, wherein the upper electrode layer includes a metal that is different from a metal of the first hard mask layer.

18. A method of manufacturing a magnetoresistive random access memory (MRAM) device, the method comprising:
forming a first insulating interlayer and a lower electrode contact on a substrate such that the lower electrode contact extends through the first insulating interlayer;
sequentially forming a lower electrode layer, a magnetic tunnel junction layer, an upper electrode layer, and a first hard mask layer on the first insulating interlayer and the lower electrode contact such that the first hard mask layer includes a metal that is different from a metal of the upper electrode layer;
forming a second hard mask on the first hard mask layer;
etching the first hard mask layer and the upper electrode layer using the second hard mask as an etching mask to form a first hard mask and an upper electrode, respectively;
forming a spacer on sidewalls of the upper electrode and the first and second hard masks; and
etching the magnetic tunnel junction layer and the lower electrode layer using the first hard mask, the second hard mask, and the spacer as an etching mask to form a structure including a lower electrode and a magnetic tunnel junction pattern on the lower electrode contact, wherein the first hard mask remains on the upper electrode after etching the magnetic tunnel junction layer and the lower electrode layer, and wherein etching the magnetic tunnel junction layer and the lower electrode layer using the first and second hard masks and the spacer as the etching mask includes removing the second hard mask.

19. The method as claimed in claim 18, wherein:

the first hard mask includes a metal or a metal nitride, and the first hard mask has a resistance that is higher than a resistance of the upper electrode layer.

20. The method as claimed in claim 18, wherein:

the spacer includes an insulation material, a metal, or a metal nitride, and the spacer has a resistance that is higher than a resistance of the upper electrode layer.

* * * * *